United States Patent [19]

Russell

[11] 4,128,804
[45] Dec. 5, 1978

[54] GROUND FAULT DEFEAT CABLE FOR HIGH CURRENT STATIC TRIP CIRCUIT BREAKER TEST SETS

[75] Inventor: Ronald R. Russell, Plainville, Conn.

[73] Assignee: General Electric Company, New York, N.Y.

[21] Appl. No.: 870,904

[22] Filed: Jan. 19, 1978

[51] Int. Cl.² .......................................... G01R 31/02
[52] U.S. Cl. ............................. 324/28 CB; 324/28 R
[58] Field of Search .................... 323/45, 48; 317/137; 324/28 R, 28 CB

[56] References Cited

U.S. PATENT DOCUMENTS

| 3,678,372 | 7/1972 | Elder | 323/45 |
| 3,894,284 | 7/1975 | Morrison | 324/28 R |
| 3,919,504 | 11/1975 | Crosley | 324/28 R |

Primary Examiner—M. Tokar
Attorney, Agent, or Firm—Robert A. Cahill; Walter C. Bernkopf; Philip L. Schlamp

[57] ABSTRACT

A high current field test set is electrically connected to pass test currents of overcurrent proportions through a single pole of a multipole static trip circuit breaker. The normal electrical connections between the breaker phase and neutral current sensing transformers and the static trip unit are made via a ground fault defeat cable which serves to automatically route the phase current monitoring signals produced by the test currents and fed to the appropriate trip unit phase overcurrent signal processing network through two primary windings of the ground fault sensing differential current transformer in opposite directions, thereby inhibiting a ground fault trip function.

5 Claims, 2 Drawing Figures

GROUND FAULT DEFEAT CABLE FOR HIGH CURRENT STATIC TRIP CIRCUIT BREAKER TEST SETS

BACKGROUND OF THE INVENTION

Modern circuit protection increasingly calls for circuit breakers equipped with so-called "static" or electronic trip units in lieu of the traditional thermal-magnetic or dual-magnetic trip units operating to effect automatic opening of the breaker contacts in response to overcurrent conditions ranging from light overload to heavy short circuit. Static trip units are found to be more versatile and precise in terms of selectively establishing multiple overcurrent trip pick-up levels and trip time delays. For example, currently available static trip units have the capability of selectively establishing coordinated long-time delay, short-time delay and instantaneous current pick-up levels, as well as different tolerance bands of time delays. As a consequence, the trip settings of a static trip circuit breaker can be readily tailored to a particular load so as to provide proper protection and yet avoid vexatious nuisance tripping.

Another reason for the current popularity of static trip circuit breakers is the increasing demand for ground fault protection. Since response to a ground fault condition is best handled electronically, it becomes quite practical to integrate the ground fault trip function into an overcurrent responsive electronic trip unit in contrast providing an electronic ground fault trip unit plus a traditional electromechanical trip unit.

Once a static trip circuit breaker goes into the field, it is desirable to periodically verify its continuing capability to provide the full measure of circuit protection intended for a particular application. To this end, field test sets of two types have been made available. In one type, low current, fault simulating signals are injected into the secondary circuits of the breaker phase current sensing transformers whose secondary are connected as separate inputs to the static trip unit. If the trip unit is functioning properly, it will process these fault simulating signals pursuant to initiating a trip function as though corresponding high currents of overload proportions actually flow through the breaker poles, i.e., the primaries of the breaker current transformers. Applicant's co-pending application Ser. No. 815,628, filed July 14, 1977 discloses a static trip circuit breaker field test set of this type.

With the other type of static trip circuit breaker field test set, a high current of overcurrent proportions is passed through the breaker poles to verify that the breaker will trip with the appropriate delay. When a static trip circuit breaker is equipped with integral ground fault protection, the high current from the test set must be passed in opposite directions through two of the breaker poles in series, otherwise the ground fault sensing differential current transformer within the trip unit would be unbalanced, precipitating the initiation of a ground fault trip function. If the test current is passed through but one breaker pole, the consequent tripping of the circuit breaker cannot be said to verify the operability of the overcurrent tripping capability of the trip unit, since it is quite likely the breaker tripped in response to the differential current transformer unbalance. Thus verification of the overcurrent trip settings and trip time delays established in the trip unit cannot be reliably obtained.

As noted above, the current practice in defeating a ground fault trip function is to pass the high current generated by the test set in opposite directions through two of the breaker poles in series. Since the typical high current field test set is portable in nature and operates at a relatively low voltage, the added impedance of the second breaker pole severely limits the maximum level of test current the test set can develop. As a consequence, in many situations the test set cannot generate sufficient current levels to verify the operability of the static trip circuit breaker under simulated heavy overload and short circuit conditions.

It is accordingly an object of the present invention to provide a high current static trip circuit breaker field test set which is equipped with means for defeating a ground fault trip function without having to pass the test current through two breaker poles in series.

An additional object of the present invention is to provide a ground fault defeat cable for connecting the breaker current transformers to the static trip unit pursuant to inhibiting the initiation of a ground fault trip function despite the fact that high levels of test current is passed through but a single breaker pole.

Yet another object of the present invention is to provide a ground fault defeat cable of the above character which is inexpensive to manufacture and convenient to use in the field.

Other objects of the invention will in part be obvious and in part appear hereinafter.

SUMMARY OF THE INVENTION

In accordance with the present invention, there is provided a ground fault defeat cable for use in conjunction with a high current field test set in verifying the phase overcurrent tripping capability of a ground fault equipped circuit breaker static trip unit. The ground fault defeat cable of the present invention functions to automatically inhibit the initiation of a ground fault trip function while test current of overload proportions generated by the test set is passed through but a single pole of a multipole circuit breaker. In its application, the ground fault defeat cable is simply utilized to make the normal electrical connections between the various phase and neutral current transformers and the static trip unit. The defeat cable also makes the electrical connections between the circuit breaker trip solenoid and the static trip unit. When a test current of overcurrent proportions is passed through a single pole of the circuit breaker, the associated phase current transformer develops an overcurrent indicative monitoring signal which is routed by the defeat cable, not only to the appropriate phase overcurrent signal processing network of the trip unit, but also through two primary windings of the trip unit's ground fault sensing differential current transformer in opposite directions. As a consequence, the differential current transformer remains balanced and a ground fault trip function cannot then be initiated, despite the fact that test current is passed through only one breaker pole. Since ground fault tripping is inhibited, the tripping responses of the static trip unit to varying levels of phase overcurrent can be thoroughly tested. Since, by virtue of the present invention, test current need not be passed through two breaker poles in series in order to prevent the initiation of a ground fault trip function, the test set is capable of developing significantly higher levels of phase test current, thus rendering it practical to test the circuit breaker under extreme short circuit conditions.

The invention accordingly comprises the features of construction, combination of elements, and arrangement of parts which will be exemplified in the construction hereinafter set forth and the scope of the invention will be indicated in the claims.

For a fuller understanding of the nature and object of the invention, reference should be had to the following detailed description taken in conjunction with the accompanying drawings, in which:

FIG. 1 is a simplified perspective view illustrating the manner in which the ground fault defeat cable of the present invention is implemented pursuant to enabling a high current field test set to pass test current of overcurrent proportions through but a single pole of a multipole, ground fault equipped static trip circuit breaker; and FIG. 2 is a simplified circuit schematic diagram illustrating the electrical connections between the circuit breaker phase and neutral current transformers and its static trip unit as effected by ground fault defeat cable of the present invention.

Corresponding reference numerals refer to like parts throughout the several views of the drawing.

DETAILED DESCRIPTION

Figure 1:
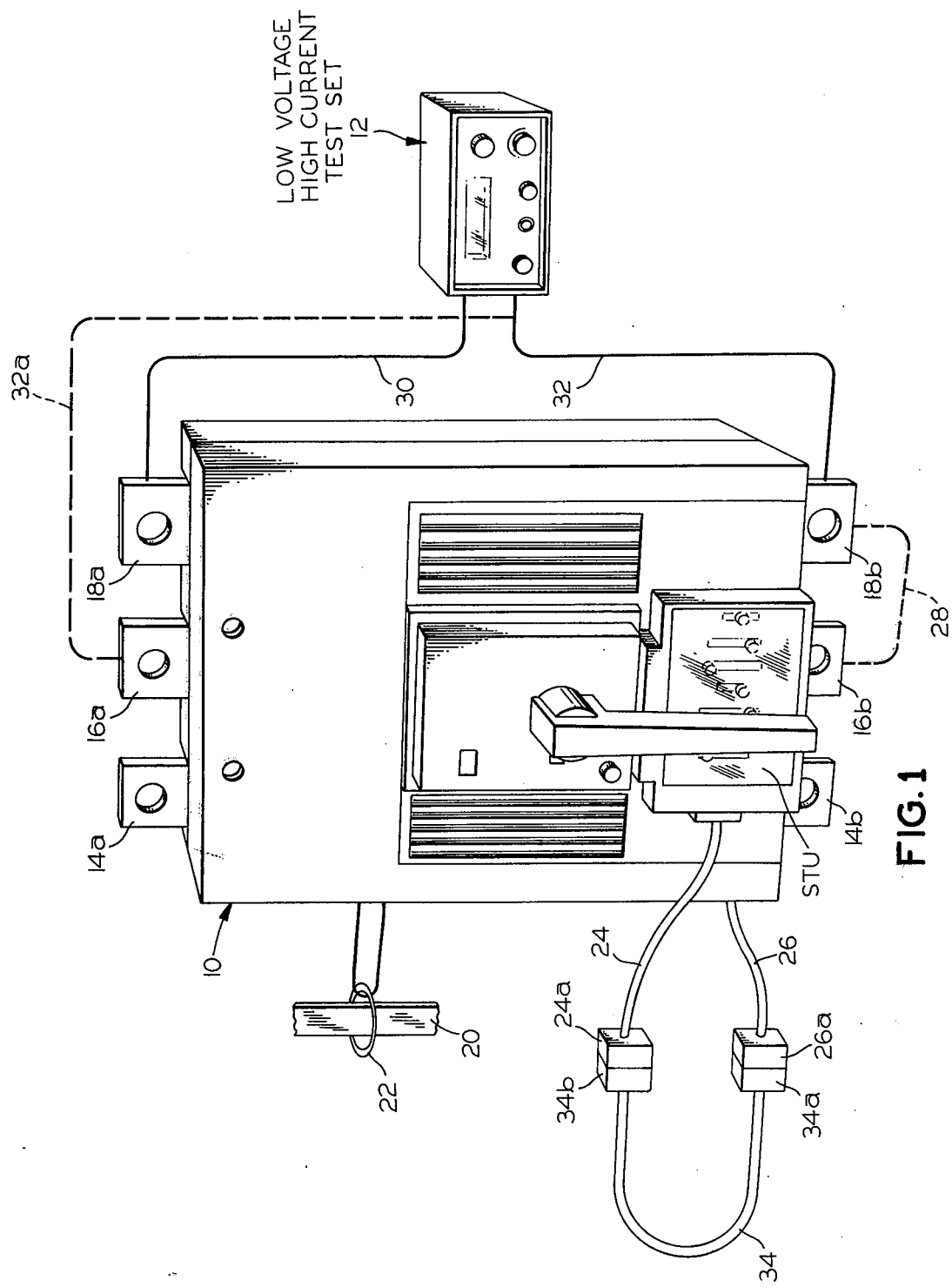
Figure 2:
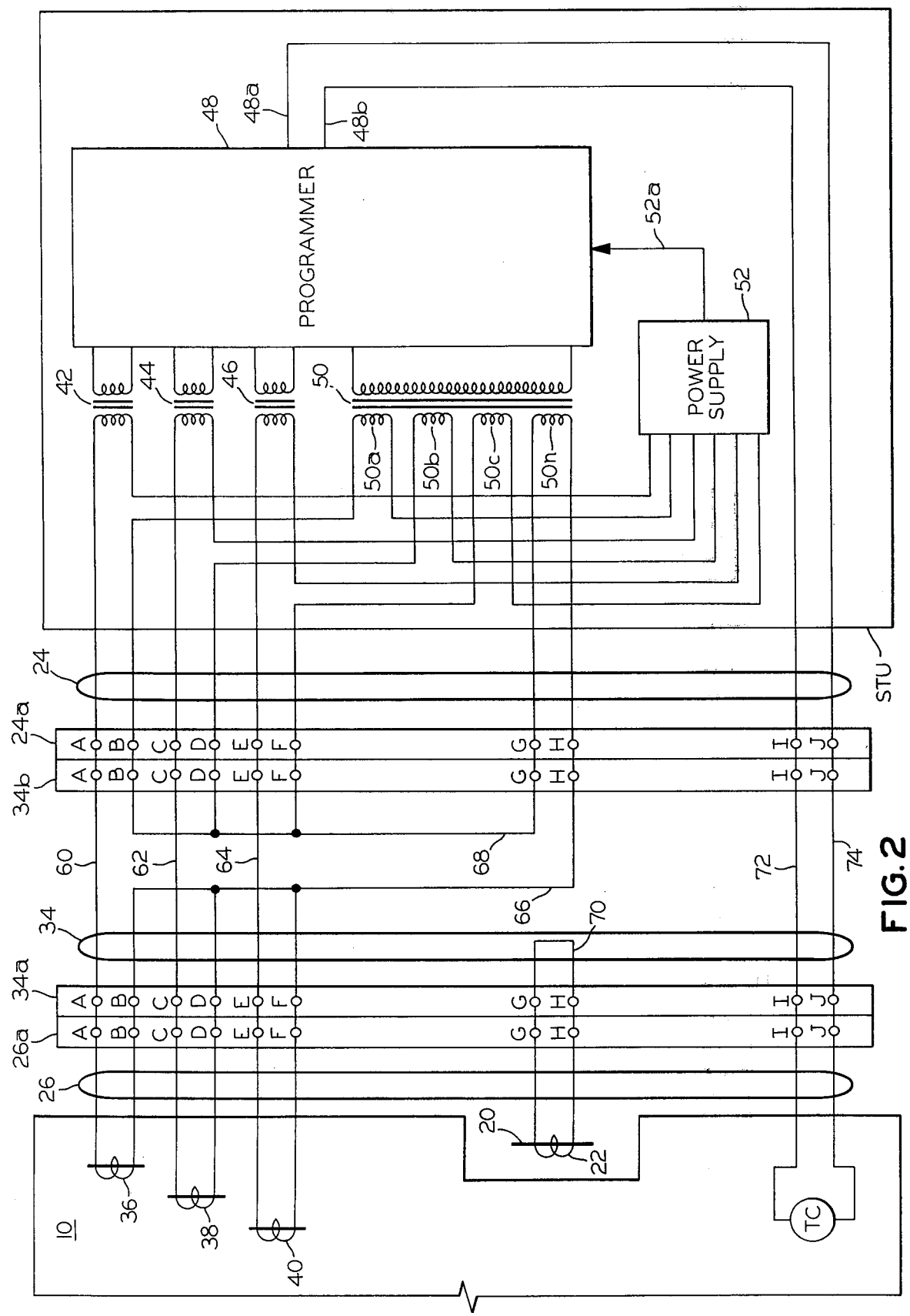

Referring first to FIG. 1, there is shown a three pole, ground fault equipped static trip circuit breaker, generally indicated at 10, whose phase overcurrent tripping capability is to be tested using a low voltage, high current field test set, generally indicated at 12. As illustrated, the breaker includes line and load terminals 14a and 14b as terminations of its left pole, line and load terminals 16a and 16b as terminations for its center pole, and line and load terminals 18a and 18b as terminations for its right pole. As is well understood and as schematically illustrated in FIG. 2, phase current transformers are inductively coupled with each breaker pole for individually sensing the phase currents flowing therethrough. If the particular circuit in which the breaker is installed includes a neutral bus 20, then a neutral current transformer 22 is inductively coupled therewith to sense neutral current. The secondary winding of this neutral transformer is terminated in lead wires which together with lead wires terminating the secondary windings of the three phase current transformers make up a breaker harness cable 26 which itself is terminated in a multipin connector 26a. When the breaker is in service, connector 26a mates with a connector 24a of a harness cable 24 leading to a static trip unit STU physically adapted to the breaker.

Heretofore, terminal connectors 24a and 26a were mated to directly interconnect circuit breaker and trip unit harness cables when the breaker was removed from service to verify its phase overcurrent tripping capability using high current test set 12. When the breaker under test was equipped with integral ground fault protection, it became necessary, in order to inhibit the initiation of a ground fault trip function, to pass the test current in opposite directions through two of the breaker poles connected in series. Thus for example, load terminals 16b and 18b were connected together by a jumper, indicated in phantom at 28, while one test set output cable 30 was connected to line terminal 18a and the other output cable 32 connected to line terminal 16a, as indicated in phantom at 32a. In this manner, test current of overcurrent proportions is routed through the right pole in one direction and the center pole in the opposite direction in order to maintain the ground fault sensing current transformer of the static trip unit STU in balance.

In accordance with the present invention, connections 28 and 32a are dispensed with, and test set output cable 32 is connected directly to load terminal 18b such that test current is passed solely through the right pole in the illustrated example of FIG. 1. In order that a ground fault trip function not be initiated under these circumstances, a ground fault defeat cable 34 is electrically interposed between the circuit breaker harness cable 26 and the static trip unit harness cable 24. Specifically, the defeat cable 34 has a multipin connector 34a at one end which mates with the circuit breaker harness cable connector 26a and a multipin connector 34b at its other end which mates with the static trip unit harness cable connector 24a. For an appreciation of how the ground fault defeat cable 34 is constructed so as to prevent the initiation of a ground fault trip function when test current is passed through a single pole of breaker 10, reference is now had to FIG. 2.

As previously noted, circuit breaker 10 includes three separate phase current transformers, illustrated at 36, 38 and 40 in FIG. 2, which are positioned to individually sense the currents flowing through each of the breaker poles. The two sides of the secondary winding for phase current transformer 36 are brought out via breaker harness cable 26 to pins A and B of connector 26a. Similarly, the two sides of the secondary winding for phase current transformer 38 are brought out via breaker harness cable 26 to pins C and D, while the two sides of the secondary winding for phase current transformer 40 are brought out to pins E and F of breaker harness cable connector 26a. The two sides of the secondary winding for neutral transformer 22 are brought out via breaker harness cable 26 to pins G and H of connector 26a, while the two sides of a trip solenoid coil TC are brought out to pins I and J of cable connector 26a.

While the ground fault defeat cable 34 of the present invention may be adapted to static trip units of various designs, for purposes of illustration, trip unit STU is generally disclosed in FIG. 2 as having the construction detailed in commonly assigned U.S. Pat. No. 3,786,311. Thus, the illustrated static trip unit includes three auxiliary transformers 42, 44 and 46, each having a secondary winding separately connected to supply phase current monitoring signals to a phase overcurrent processing section of overcurrent and ground fault programmer logic, generally indicated at 48. Also included in static trip unit STU is a differential current transformer 50 having plural primary windings 50a, 50b, 50c and 50n, and a secondary winding connected to supply a current signal indicative of any imbalance in the vectorial sum of the primary currents to a ground fault signal processing section of programmer logic 48.

A power supply 52, also included in static trip unit STU, is connected to derive from the phase current monitoring signals operating power for the programmer logic 48, as supplied over connection 52a. Thus, as seen in FIG. 2, a phase current monitoring signal at pin A of connector 24a is routed via one conductor of static trip unit harness cable 24 through the primary winding of auxiliary transformer 42, down to the power supply 52, back through primary winding 50a of differential current transformer 50 and harness cable 24 to pin B of connector 24a. Similarly, a phase current monitoring signal at pin C of connector 24a is routed via harness cable 24 through the primary winding of auxiliary transformer 44, down to the power supply and back through primary winding 50b of differential current transformer 50 to pin D of connector 24a. Finally, a phase current monitoring signal at pin E of connector 24a is routed through the primary of auxiliary transformer 46, power supply 52, differential current transformer primary winding 50c and back to pin F of the static trip unit harness cable connector 24a. A neutral current monitoring signal at pin G is routed through differential current transformer primary winding 50n and back to pin H via static trip unit harness cable 24. When the programmer logic 48 is to initiate a trip function, an energizing voltage for activating the breaker trip solenoid TC is impressed across programmer output leads 48a and 48b, which are brought out via harness cable 24 to pins I and J of connector 24.

When the circuit breaker 10 is in service, cable connectors 24a and 26a are mated. Under these circumstances, it is seen that the secondary winding for phase current transformer 36 is connected in loop circuit with the primary winding of auxiliary transformer 42, power supply 52 and differential current transformer primary winding 50a. Similarly, the secondary winding for phase current transformer 38 is connected in loop circuit with the primary winding of auxiliary transformer 44, power supply 52, and differential current transformer primary winding 50b, while the secondary winding for phase current transformer 40 is connected in loop circuit with the primary winding of auxiliary transformer 46, the power supply and differential current transformer winding 50c. In addition, the secondary winding for neutral current transformer 22 is connected across differential current transformer primary winding 50n, while the programmer output leads 48a and 48b are connected across the breaker trip solenoid coil TC.

From this it is seen that when test current of overcurrent proportions developed by test set 12 of FIG. 1 is passed through but one pole of circuit breaker 10, the phase current monitoring signal developed in the associated phase current transformer secondary winding is routed through only one of the differential current transformer primary windings. Consequently, the differential current transformer is unbalanced and the programmer logic 48 will operate as though a ground fault exists, generating an output voltage across leads 48a, 48b to activate the breaker trip solenoid coil TC. To prevent this unwanted ground fault trip function from being initiated, it has been the practice heretofore to route the test current in opposite directions through two of the breaker poles connected in series, as previously noted. Under these circumstances, it is seen that the resulting phase current monitoring signals will be routed through two of the differential current transformer primary windings in opposite directions, thus maintaining a current balance to hold off the initiation of a ground fault trip function. The programmer logic is then free to fully process the phase current monitoring signals pursuant to initiating an overcurrent trip function.

To inhibit the initiation of a ground fault trip function despite the fact that test current of overcurrent proportions is passed through but a single pole of breaker 10, ground fault defeat cable 34 of the present invention is electrically interposed between harness cable 26 and static trip unit harness cable 24. Thus, as seen in FIG. 2, the defeat cable includes a lead 60 running between pins A of the connectors 34a and 34b at each end. Similarly, a lead 62 runs between pins C of connectors 34a and 34b, while a lead 64 runs between pins E of the connectors terminating the ends of the ground fault defeat cable 34. Pins B, D and F of defeat cable connector 34a mating with breaker cable connector 26a are connected in common via a lead 66 running to pin H of the defeat cable connector 34b mating with static trip unit cable connector 24a. On the other hand, pins B, D and F of the defeat cable connector 34b mating with static trip unit cable connector 24a are connected in common via a lead 68 running to pin G of defeat cable connector 34b. Pins G and H of defeat cable connector 34a are connected together by a jumper 70 which serves, with connectors 26a and 34a mated, to short together the two sides of the secondary winding for neutral current transformer 22. This is done as a precautionary measure to prevent the development of potentially hazardous high voltages across the neutral current transformer secondary winding on the off-chance that there be current flowing through neutral bus 20 while circuit breaker 10 is under test. Finally, defeat cable 34 includes leads 72 and 74 respectively interconnecting pins I and J of connectors 34a and 34b at each end. Consequently, with the defeat cable interposed between the breaker harness cable 26 and static trip unit harness cable 24, programmer output leads 48a and 48b are wired straight through to the breaker trip solenoid coil TC.

To appreciate the operation of ground fault defeat cable 34 in inhibiting the initiation of a ground fault trip function while test current is being passed through a single pole of breaker 10, assume that the resulting phase current monitoring signal is induced in the secondary of phase current transformer 36. This monitoring signal is routed via breaker harness cable 26 to pin A of connector 26a, pin A of the defeat cable connector 34a mated therewith, defeat cable lead 60, pin A of its other connector 34b, pin A of mated connector 24a and static trip unit harness cable 24 to auxiliary transformer 42. From this auxiliary transformer, the phase current monitoring signal is routed downward to the power supply 52 and then upwardly through primary winding 50a of differential current transformer 50 and out via the trip unit harness cable 24 to its connector pin B. From pin B of the defeat cable connector 34b, this phase current monitoring signal is routed via lead 68 of the defeat cable down to pin G of the same connector 34b, pin G of mated connector 24a, static trip unit harness cable 24, downwardly through differential current transformer primary winding 50n and back to pin H of the static trip unit harness cable connector 24a. From pin H of the defeat cable connector 34b, this monitoring signal is routed via lead 66 to pin B of the connector 34a at its other end, pin B of the breaker harness cable connector 26a, and the breaker harness cable 26 to the other side of the secondary winding for phase current transformer 36. It is seen that this phase current monitoring signal developed by phase current transformer 36 in breaker 10 is routed by the defeat cable so as to flow in a circuit loop through differential current transformer primary winding 50a in one direction and differential current transformer primary winding 50n in the opposite direction, thus maintaining a current balance. As a consequence, programmer logic 48 does not initiate a ground fault trip function, leaving it free to respond to the phase overcurrent monitoring signal as applied to its overcurrent signal processing section from the secondary of auxiliary transformer 42. If the programmer is functioning properly, it will develop an activating voltage across its output leads 48a, 48b either instantaneously or with appropriate delay, depending upon the level of the test current. This activating voltage is applied via leads 72 and 74 of the defeat cable to the trip solenoid coil TC, whereupon the breaker trips.

If the test current is routed through the breaker pole associated with phase current transformer 38, it is seen that the resulting phase current monitoring signal is routed by conductor 62 of defeat cable 34 through the primary winding of auxiliary transformer 44, power supply 52, upwardly through differential current transformer primary winding 50b, defeat cable conductor 68, downwardly through differential current transformer primary winding 50n, and defeat cable lead 66 back to the other side of the secondary winding for phase current transformer 38. Again, the phase current monitoring signal is routed through two differential windings in opposite directions to inhibit the initiation of a ground fault trip function. By the same token, a phase current monitoring signal developed in the secondary of phase current transformer 40 is routed via defeat cable lead 64 through the primary winding for auxiliary transformer 46, power supply 52, differential current transformer primary winding 50c in one direction, defeat cable lead 68, differential current transformer primary winding 50n in the opposite direction, and defeat cable lead 66 back to the other side of the secondary winding for phase current transformer 40.

From the foregoing description, it is seen that the ground fault defeat cable 34 of the present invention is effective in inhibiting the initiation of a ground fault trip function by a circuit breaker static trip unit during testing of the overcurrent tripping capability of the circuit breaker by passing test current of overcurrent proportions through but a single circuit breaker pole. This is achieved in a unique and efficient manner by structuring the defeat cable to automatically route the phase current monitoring signal developed in the phase current transformer associated with the breaker pole through which the test current is passed in opposite relative directions through two separate primary windings of the ground fault sensing differential current transformer included within the trip unit. In this manner, the differential current transformer remains balanced to inhibit the initiation of an unwanted ground fault trip function. The static trip unit is thus free to process the overcurrent information content of the phase current monitoring signal in its overcurrent signal processing section pursuant to initiating an overcurrent trip function. While in the illustrated example, the ground fault defeat cable makes differential current transformer primary winding 50n common to each of circuit loops individually including the other three primary windings, it will be appreciated that a defeat cable may be constructed in accordance with the teachings of the present invention to route phase current monitoring signals through any two of the differential current transformer primary windings pursuant to maintaining a current balance during a phase overcurrent trip test. That is, in some circuit applications there is no neutral bus, and consequently differential current transformer primary winding 50n may then be omitted. In this case, the defeat cable would be constructed to route phase current monitoring signals in opposite directions through two of the remaining three differential current transformer primary windings.

It will thus be seen that the objects set forth above, among those made apparent in the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described my invention, what I claim as new and desire to secure by Letters Patent is:

1. For use in conjunction with a multipole static trip circuit breaker having separate phase current sensing transformers feeding individual phase current monitoring signals to a static trip unit respectively indicative of the currents flowing through each breaker pole, the static trip unit including a ground fault sensing differential current transformer having a plurality of primary winding, and a high current test set connected to pass test current of overcurrent proportions through a single breaker pole; a ground fault defeat cable electrically interconnected between said phase current sensing transformers and said static trip unit, said defeat cable including a plurality of conductors arranged to route the phase current monitoring signal developed by the phase current transformer associated with the breaker pole through which the test current is passed in opposite relative directions through two of the differential current transformer primary windings, thereby to maintain an overall primary current balance so as to prevent the initiation of a ground fault trip function by said trip unit.

2. The ground fault defeat cable defined in claim 1, wherein the differential current transformer includes a separate primary winding associated with each phase current sensing transformer and electrically connected thereto by said defeat cable to pass therethrough a phase current monitoring signal developed by its associated phase current sensing transformer, said differential current transformer further including an additional primary winding normally associated with a neutral current sensing current transformer, said conductors of said defeat cable arranged to route a phase current monitoring signal developed by any one of the phase current sensing transformers through its associated differential current transformer primary winding in one direction and through said additional differential current transformer primary winding in a direction opposite said one direction.

3. The ground fault defeat cable defined in claim 1, wherein the circuit breaker includes a trip solenoid coil normally electrically connected for energization from said trip unit, said defeat cable including additional conductors completing the electrical connection between said trip solenoid coil and said trip unit.

4. The ground fault defeat cable defined in claim 2, which further includes a jumper conductor electrically connected to short the secondary winding of a neutral current sensing transformer.

5. The ground fault defeat cable defined in claim 2, wherein the circuit breaker includes a trip solenoid coil normally electrically connected for energization from said trip unit, said defeat cable including additional conductors completing the electrical connection between said trip solenoid coil and said trip unit.

* * * * *